US007138653B1

(12) United States Patent
Akram

(10) Patent No.: US 7,138,653 B1
(45) Date of Patent: Nov. 21, 2006

(54) STRUCTURES FOR STABILIZING SEMICONDUCTOR DEVICES RELATIVE TO TEST SUBSTRATES AND METHODS FOR FABRICATING THE STABILIZERS

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 401 days.

(21) Appl. No.: 09/590,527

(22) Filed: Jun. 8, 2000

(51) Int. Cl.
*H01L 29/10* (2006.01)
*H01L 21/00* (2006.01)
*F02P 17/00* (2006.01)
*G01R 31/26* (2006.01)

(52) U.S. Cl. .................. 257/48; 438/11; 324/383; 324/719; 324/752; 324/765

(58) Field of Classification Search ............... 438/14, 438/17, 11; 324/755, 528, 765; 257/48, 257/773; 329/383, 752, 719, 765
See application file for complete search history.

(56) References Cited

U.S. PATENT DOCUMENTS

| 5,051,870 | A | * | 9/1991 | Companion ................ 361/773 |
| 5,173,220 | A | | 12/1992 | Reiff et al. |
| 5,220,200 | A | * | 6/1993 | Blanton ...................... 257/778 |
| 5,264,061 | A | | 11/1993 | Juskey et al. |

(Continued)

FOREIGN PATENT DOCUMENTS

JP       402210329    *   8/1990

(Continued)

OTHER PUBLICATIONS

Miller et al., "Maskless Mesoscale Materials Deposition", Deposition Technology, Sep. 2001, pp. 20-22.

(Continued)

*Primary Examiner*—Carl Whitehead, Jr.
*Assistant Examiner*—James M. Mitchell
(74) *Attorney, Agent, or Firm*—TraskBritt

(57) ABSTRACT

Stabilizers to be disposed on a surface of a semiconductor device or test substrate and methods of fabricating and disposing the stabilizers on semiconductor devices and test substrates. Semiconductor devices and test substrates including the stabilizers are also disclosed, as well as assemblies wherein the stabilizers are disposed between a semiconductor device and a test substrate. One or more of the stabilizers are disposed on the surface of a semiconductor device or test substrate prior to bonding the semiconductor device face-down upon the test substrate. Upon assembly of the semiconductor device face-down upon a test substrate and establishing electrical communication between contact pads of the semiconductor device and test pads of the test substrate, such as with conductive structures, the stabilizers prevent the semiconductor device from tipping or tilting relative to the test substrate. The stabilizers nay be preformed structures which are attached to a surface of a semiconductor device, test substrate, or both. Alternatively, the stabilizers can be fabricated on the surface of the semiconductor device, the test substrate, or both. A stereolithographic method of fabricating the stabilizers is disclosed. The stereolithographic method may include use of a machine vision system including at least one camera operably associated with a computer controlling a stereolithographic application of material so that the system may recognize the position and orientation of a semiconductor device or test substrate on which the stabilizer is to be fabricated.

24 Claims, 10 Drawing Sheets

U.S. PATENT DOCUMENTS

| | | | |
|---|---|---|---|
| 5,278,442 | A | 1/1994 | Prinz et al. |
| 5,369,551 | A | 11/1994 | Gore et al. |
| 5,484,314 | A | 1/1996 | Farnworth |
| 5,489,854 | A * | 2/1996 | Buck et al. ............... 324/761 |
| 5,657,207 | A * | 8/1997 | Schreiber et al. .......... 174/254 |
| 5,657,854 | A * | 8/1997 | Chen et al. ............... 193/35 R |
| 5,684,677 | A | 11/1997 | Uchida et al. |
| 5,705,117 | A | 1/1998 | O'Connor et al. |
| 5,880,590 | A * | 3/1999 | Desai et al. ............... 324/757 |
| 5,955,888 | A * | 9/1999 | Frederickson et al. ...... 324/761 |
| 5,985,682 | A * | 11/1999 | Higgins, III ............... 324/765 |
| 6,081,429 | A * | 6/2000 | Barrett ...................... 257/686 |
| 6,184,062 | B1 * | 2/2001 | Brofman et al. ............ 438/106 |
| 6,229,324 | B1 | 5/2001 | Akram et al. |
| 6,251,488 | B1 | 6/2001 | Miller et al. |
| 6,256,549 | B1 | 7/2001 | Romero et al. |
| 6,259,962 | B1 | 7/2001 | Gothait |
| 6,268,584 | B1 | 7/2001 | Keicher et al. |
| 6,292,003 | B1 * | 9/2001 | Fredrickson et al. ........ 324/754 |
| 6,292,007 | B1 * | 9/2001 | Potter ........................ 324/754 |
| 6,326,698 | B1 | 12/2001 | Akram |
| 6,377,061 | B1 * | 4/2002 | Settle et al. ............... 324/755 |
| 6,391,251 | B1 | 5/2002 | Keicher et al. |
| 6,410,366 | B1 * | 6/2002 | Hashimoto ................. 438/125 |
| 6,452,807 | B1 | 9/2002 | Barrett |
| 6,461,881 | B1 | 10/2002 | Farnworth et al. |
| 6,469,530 | B1 | 10/2002 | Johnson et al. |
| 6,506,671 | B1 | 1/2003 | Grigg |
| 6,525,408 | B1 | 2/2003 | Akram et al. |
| 6,529,027 | B1 * | 3/2003 | Akram et al. ............... 324/758 |
| 6,544,821 | B1 | 4/2003 | Akram |
| 6,548,897 | B1 | 4/2003 | Grigg |
| 6,569,753 | B1 | 5/2003 | Akram et al. |
| 6,627,483 | B1 | 9/2003 | Ondricek et al. |
| 6,630,365 | B1 | 10/2003 | Farnworth et al. |
| 6,728,653 | B1 | 4/2004 | Figueredo |
| 2001/0051395 | A1 * | 12/2001 | Grigg ........................ 438/107 |
| 2002/0011859 | A1 * | 1/2002 | Smith et al. ............... 324/755 |
| 2002/0043711 | A1 | 4/2002 | Akram et al. |
| 2002/0068417 | A1 * | 6/2002 | Farnworth et al. .......... 438/455 |
| 2002/0105074 | A1 | 8/2002 | Akram et al. |
| 2002/0109519 | A1 | 8/2002 | Tustaniwskyj et al. |
| 2002/0171177 | A1 | 11/2002 | Kritchman et al. |
| 2003/0022462 | A1 | 1/2003 | Farnworth et al. |
| 2003/0089999 | A1 | 5/2003 | Akram |
| 2003/0092220 | A1 | 5/2003 | Akram |
| 2003/0098499 | A1 | 5/2003 | Akram et al. |
| 2003/0139030 | A1 | 7/2003 | Grigg |
| 2003/0151167 | A1 | 8/2003 | Kritchman et al. |
| 2003/0173665 | A1 | 9/2003 | Grigg |
| 2003/0176016 | A1 | 9/2003 | Grigg |
| 2003/0203612 | A1 | 10/2003 | Akram et al. |

FOREIGN PATENT DOCUMENTS

| | | | |
|---|---|---|---|
| JP | 403184391 | * | 8/1991 |
| JP | 406163656 | * | 6/1994 |
| JP | 406201772 | * | 7/1994 |
| JP | 407013169 | | 1/1995 |
| JP | 09127513 | * | 5/1997 |
| JP | 11-160396 | * | 6/1999 |

OTHER PUBLICATIONS

Miller, "New Laser-Directed Deposition Technology", Microelectronic Fabrication, Aug. 2001, p. 16.

Webpage, Objet Prototyping the Future, "Objet FullCure700 Series", 1 page.

Webpage, Objet Prototyping the Future, "How it Works", 2 pages.

U.S. Appl. No. 09/590,621, filed Jun. 8, 2000, entitled "Stereolithographic Method and Apparatus for Fabricating Stabilizers for Flip-Chip Type Semiconductor Devices and Resulting Structures", inventor Akram et al.

U.S. Appl. No. 10/201,208, filed Jul. 22, 2002, entitled "Thick Solder Mask for Confining Encapsulant Materials Over Selected Locations of a Substrate, Assemblies Including the Solder Mask, and Methods", inventor Grigg et al.

U.S. Appl. No. 10/688,354, filed Oct. 17, 2003, entitled "Thick Solder Mask for Confining Encapsulant Material Over Selected Locations of a Substrate and Assemblies Including the Solder Mask", inventor Grigg et al.

* cited by examiner

STRUCTURES FOR STABILIZING SEMICONDUCTOR DEVICES RELATIVE TO TEST SUBSTRATES AND METHODS FOR FABRICATING THE STABILIZERS

BACKGROUND OF THE INVENTION

1. Field of the Invention

The present invention relates generally to structures for stabilizing a semiconductor device, such as a chip scale package (CSP) or a semiconductor die, upon a test substrate. The present invention also relates to methods of fabricating such stabilizers. More specifically, the invention pertains to stereolithographically formed stabilizers and to the use of stereolithographic methods to fabricate the stabilizers.

2. State of the Art

Semiconductor Devices and Chip Scale Packages

Semiconductor devices of a leads-over-chip (LOC) configuration, as well as flip-chip type or configuration, including chip scale packages (CSPs), are widely used in the electronics industry. The electrical characteristics of semiconductor devices are typically tested by placing a semiconductor device facedown on a test substrate to establish an electrical connection between contact pads on a surface of the semiconductor device and corresponding test pads of the test substrate. The test pads of the test substrate are arranged in a mirror image to the corresponding contact pads on the semiconductor device. Conductive structures, typically solder bumps, conductive pillars, conductor-filled epoxy, or z-axis conductive elastomer, are sometimes applied to and protrude from the contact pads of the tested semiconductor device prior to testing of the semiconductor device. Conductive structures facilitate desired communication between the contact pads of the semiconductor device and the corresponding test pads of the test substrate and may also be employed later to effect a permanent connection to a carrier substrate.

When the contact pads are concentrated over a small area of the semiconductor device, such as in one or more centrally located rows (e.g., LOC-type dice) or adjacent a single edge of the semiconductor device, or are not positioned over a large enough area of the semiconductor device that conductive structures secured thereto will support the semiconductor device in facedown orientation on a test substrate, conductive structures that protrude from the contact pads may lend to instability as the semiconductor device is disposed on a test substrate. Consequently, a semiconductor device with contact pads concentrated over a relatively small area thereof is prone to being tipped or tilted from a plane that is substantially parallel to the plane of the test substrate.

FIG. 1 illustrates a semiconductor device 200 having two centrally located rows of contact pads 202 on a surface 204 thereof. The two rows of contact pads 202 are located between opposite side edges 226 and 228 of semiconductor device 200 and extend generally parallel to side edges 226 and 228.

In FIG. 2, semiconductor device 200 is illustrated as being assembled with a test substrate 210. Test substrate 210 has test pads 230 exposed at a surface 214 thereof. When semiconductor device 200 is invertedly assembled with test substrate 210, contact pads 202 are aligned with their corresponding test pads 230. Contact pads 202 are typically temporarily connected to their corresponding test pads 230 by way of conductive structures disposed between contact pads 202 and test pads 230. The conductive structures illustrated in FIGS. 1–4 are solder bumps 220. Typically, solder bumps 220 are joined to contact pads 202 and contact test pads 230 as semiconductor device 200 is inverted relative to test substrate 210. In many test processes, semiconductor device 200 is biased toward test substrate 210 to ensure that the conductive structures contact their corresponding test pads 230. Test pads 230 communicate with known testing equipment and, thereby, facilitate the analysis of semiconductor device 200 by such testing equipment.

As noted previously and illustrated in FIG. 3, since contact pads 202 are arranged on surface 204 in centrally located rows, when semiconductor device 200 is assembled with test substrate 210, semiconductor device 200 may tip or tilt relative to test substrate 210. When tipping or tilting occurs, if the angle at which semiconductor device 200 tips or tilts relative to test substrate 210 is great enough, contact pads 202 in one of the rows can be lifted off of test pads 230, breaking electrical connections therebetween. In addition, if semiconductor device 200 tips or tilts too much relative to test substrate 210, semiconductor device 200 may contact test substrate 210 and thereby cause an electrical short to occur.

FIG. 4 illustrates that the same problems can occur with a semiconductor device 200' having only a single, centrally located row of contact pads 202. While tipping or tilting of semiconductor device 200' does not lift a row of solder bumps 220 from test pads 230 of test substrate 210, semiconductor device 200' can nonetheless undesirably contact test substrate 210.

Moreover, the compressive forces that may be applied to semiconductor device 200 during testing thereof may overly stress and damage semiconductor device 200.

Thus, it is apparent that a need exists for a method and apparatus for stabilizing the assembly of a semiconductor device with contact pads and conductive structures concentrated in a relatively small area thereof and/or conductive structures in an inherently unstable arrangement, such as a LOC-type semiconductor die or a chip scale package, with a test substrate.

Stereolithography

In the past decade, a manufacturing technique termed "stereolithography," also known as "layered manufacturing," has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, or semi-solid, state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form, and the material itself may be consolidated or fixed or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials and has also been used to fabricate small quantities of objects where the cost of conventional fabrication techniques is prohibitive for the same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. In particular, the inventor is not aware of the use of stereolithography to fabricate stabilizer or stabilization structures for use on semiconductor devices, such as flip-chip type semiconductor devices or ball grid array packages. Furthermore, conventional stereolithography apparatus and methods fail to address the difficulties of precisely locating and orienting a number of pre-existing components for stereolithographic application of material thereto without the use of mechanical alignment techniques or to otherwise assure precise, repeatable placement of components.

SUMMARY OF THE INVENTION

The present invention includes stabilizers, which are also referred to herein as support structures or as outriggers, that stabilize a semiconductor device when the semiconductor device is temporarily disposed upon a test substrate. Stabilizers incorporate teachings of the present invention are particularly useful for testing semiconductor devices having contact pads that are arranged in a manner that, when conductive structures are secured to the contact pads, the conductive structures will not prevent the semiconductor device from tilting or tipping. Such tilting or tipping can occur, for example, when the contact pads of the semiconductor devices and, thus the conductive structures protruding therefrom, are concentrated in a small area (e.g., less than half of the semiconductor device active surface, or are otherwise located in a pattern susceptible to tilting. Examples of semiconductor devices having concentrated contact pads include, without limitation, LOC-type semiconductor dice, the contact pads or bond pads of which are positioned in one or more centrally located rows, and semiconductor devices having contact pads disposed adjacent only a single edge thereof.

Stabilizers incorporating teachings of the present invention are preferably configured to, along with the conductive structures protruding firm a semiconductor device, stabilize a semiconductor device as it is disposed facedown upon a test substrate. In addition, the stabilizers of the present invention preferably maintain a substantially parallel relation between a test substrate and a semiconductor device to be disposed thereon. Moreover, the stabilizers may serve to limit stress on the semiconductor device during testing by "bottoming out" the semiconductor device as a compressive force is applied thereto. The stabilizers of the present invention may be configured as linear structures of substantially uniform height or as columns, bumps, or structures of other shapes that have substantially uniform heights.

In order to permit the connection of contact pads of the semiconductor device with corresponding test pads of the test substrate, the distance the stabilizers protrude from the semiconductor device or from the test substrate is preferably less than or equal to the distance that a conductive structure, such as a conductive bump, ball, or pillar, will extend between the plane of a surface of the semiconductor device and the plane of the facing surface of the test substrate upon which the semiconductor device is to be disposed.

The stabilizers are preferably positioned on the semiconductor device or the test substrate so as to, in combination with any conductive structures protruding from the semiconductor device, stabilize the semiconductor device upon the test substrate without interfering with electrical connections between the semiconductor device and the test substrate. For example, the stabilizers can be positioned at or near the corners of the surface of the semiconductor device, at or near the edges of the semiconductor device, or in an array over the surface of the semiconductor device. The stabilizers can also be positioned on the test substrate at locations thereof that correspond to the corners or opposing edges of a semiconductor device to be disposed thereon.

The stabilizers can be secured to one or both of the semiconductor device to be tested and the test substrate. For example, the stabilizers can be fabricated directly on the semiconductor device or the test substrate or fabricated separately therefrom, then positioned in desired locations on the surface of the semiconductor device or test substrate and secured thereto. When the stabilizers of the present invention are fabricated on a semiconductor die or a test substrate fabricated on a layer of semiconductive material, the stabilizers can be fabricated on a single die, a collection of individual, singulated dice, or on a wafer including a plurality of unsingulated dice. The stabilizers can similarly be fabricated on other substrates either singly or collectively.

The stabilizers of the invention can be made by various known methods for fabricating features of semiconductor devices. By way of example and not limitation, mask and etch processes may be used to fabricate the stabilizers on a substrate (e.g., a semiconductor die, a semiconductor test substrate, a wafer including multiple dice or test substrates, or another substrate) from dielectric materials, photoresist material can be patterned to form the stabilizers, or the stabilizers can be die cut from a layer of dielectric material. In a preferred embodiment of the invention, stereolithography, or layered manufacturing, processes are employed to fabricate the stabilizers.

The present invention preferably employs computer-controlled, 3-D CAD initiated, stereolithography techniques to fabricate the stabilizers of the present invention. When stereolithographic processes are employed, the stabilizers may each be formed as either a single layer or a series of superimposed, contiguous, mutually adhered layers of material.

When the stabilizers are fabricated directly on a semiconductor device or test substrate by use of stereolithography, the stabilizers may be fabricated to extend to a given plane regardless of any irregularities on or nonplanarity of the surface of the semiconductor device on which the stabilizers are fabricated.

The stereolithographic method of fabricating the stabilizers of the present invention preferably includes the use of a machine vision system to locate the semiconductor devices or test substrates on which the stabilizes are to be fabricated, as well as the features or other components on or associated with the semiconductor devices or test substrates (e.g., solder bumps, contact pads, conductor traces, etc.). A machine vision system is preferably used to direct the alignment of a stereolithography system with each semiconductor device or test substrate for material disposition purposes. Accordingly, the semiconductor devices or test substrates need not be precisely, mechanically aligned with respect to any component of the stereolithography system to practice the stereolithographic embodiment of the method of the present invention.

In a preferred embodiment, the stabilizers to be fabricated upon or positioned upon and secured to a semiconductor device or a test substrate in accordance with the invention are fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the substrate.

Other features and advantages of the present invention will become apparent to those of skill in the art through consideration of the ensuing description, the accompanying drawings, and the appended claims.

BRIEF DESCRIPTION OF THE DRAWINGS

The accompanying drawings illustrate exemplary embodiments of the invention, wherein some dimensions may be exaggerated for the sake of clarity, and wherein.

DETAILED DESCRIPTION OF THE INVENTION

Stabilizers

Figure 1:
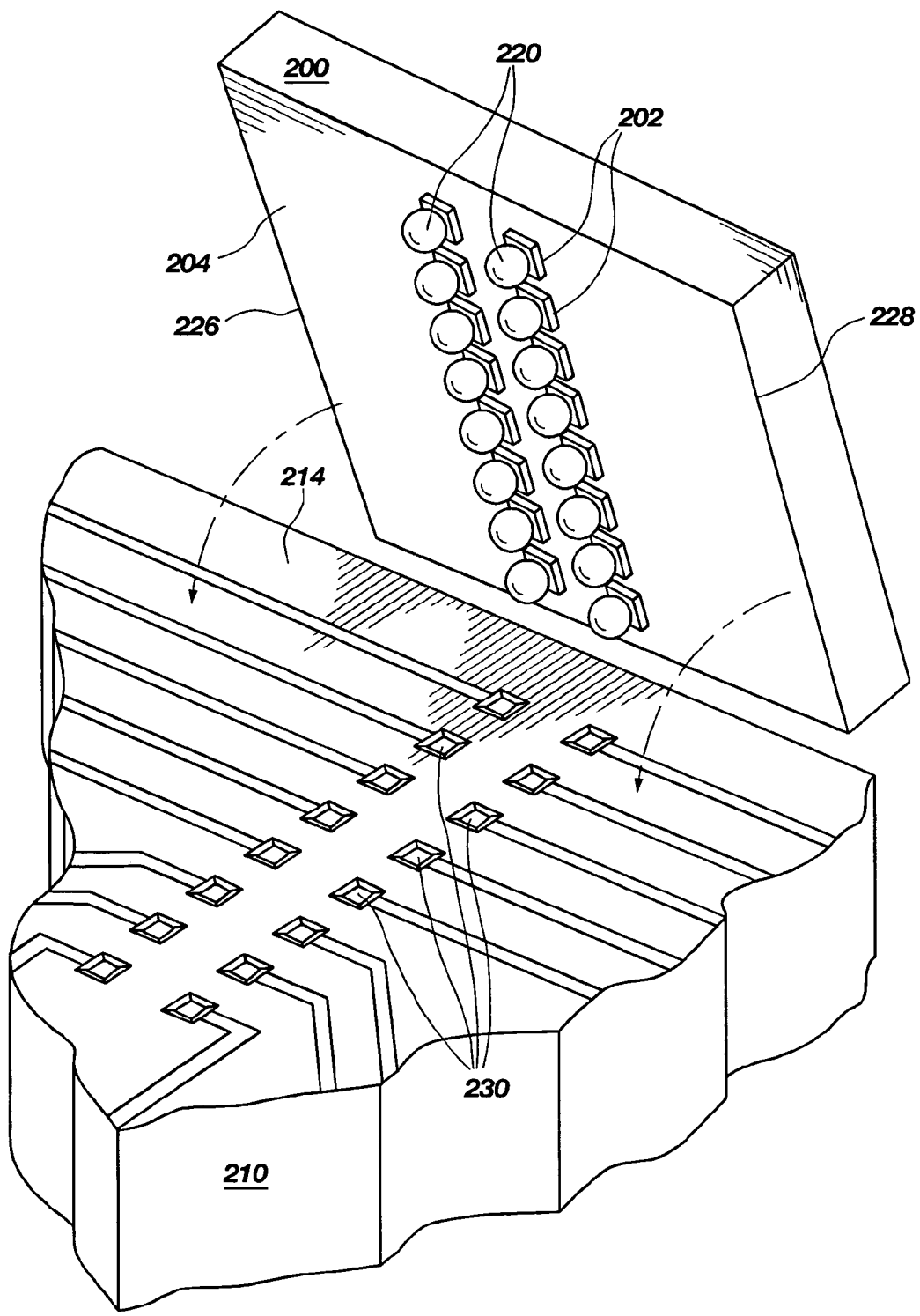
FIG. 1 is an enlarged perspective partial view of a semiconductor device positioned above a test substrate upon which the semiconductor device is to be disposed in a facedown orientation.
Figure 2:
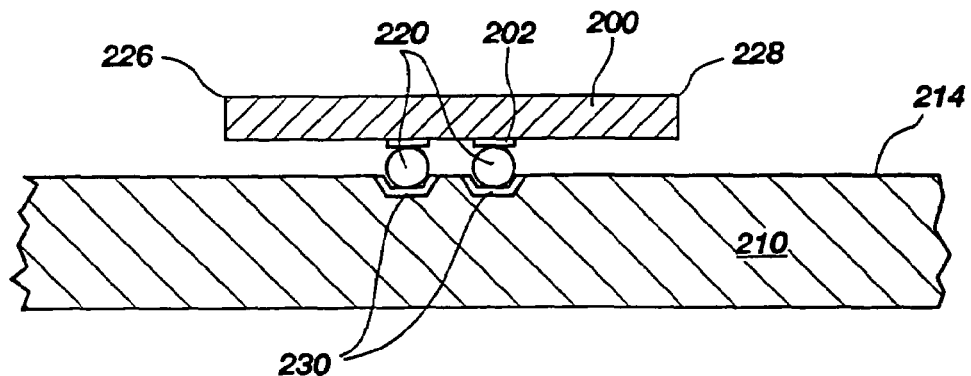
FIG. 2 is a cross-sectional view of an assembly including a semiconductor device disposed on a test substrate in a facedown orientation.
Figure 3:
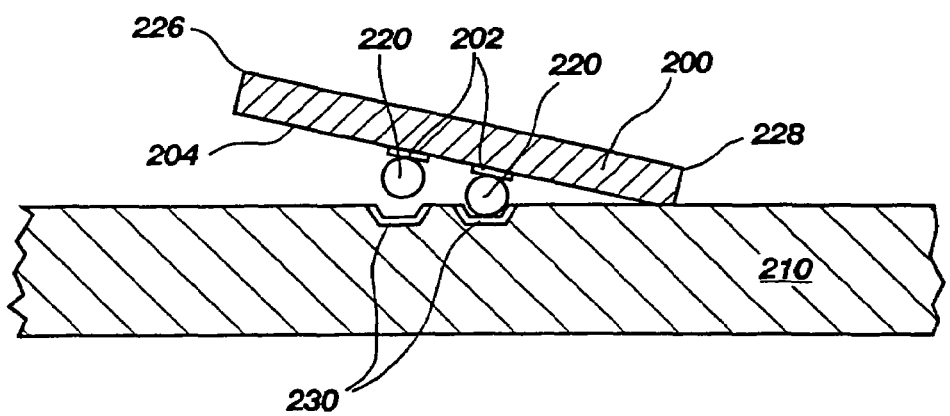
FIG. 3 is a cross-sectional view of the assembly of FIG. 2, with the semiconductor device being tipped or tilted relative to the test substrate.
Figure 4:
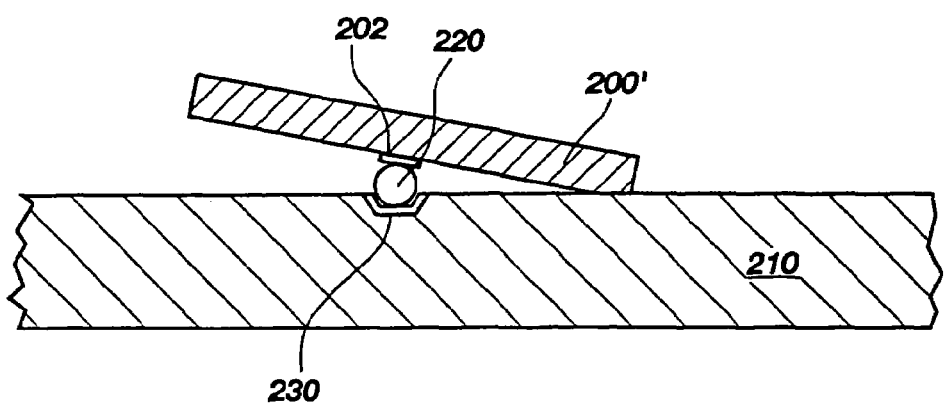
FIG. 4 is a cross-sectional view of an assembly including another semiconductor device disposed on a test substrate in a facedown orientation, with the semiconductor device being tipped or tilted relative to the test substrate.
Figure 5:
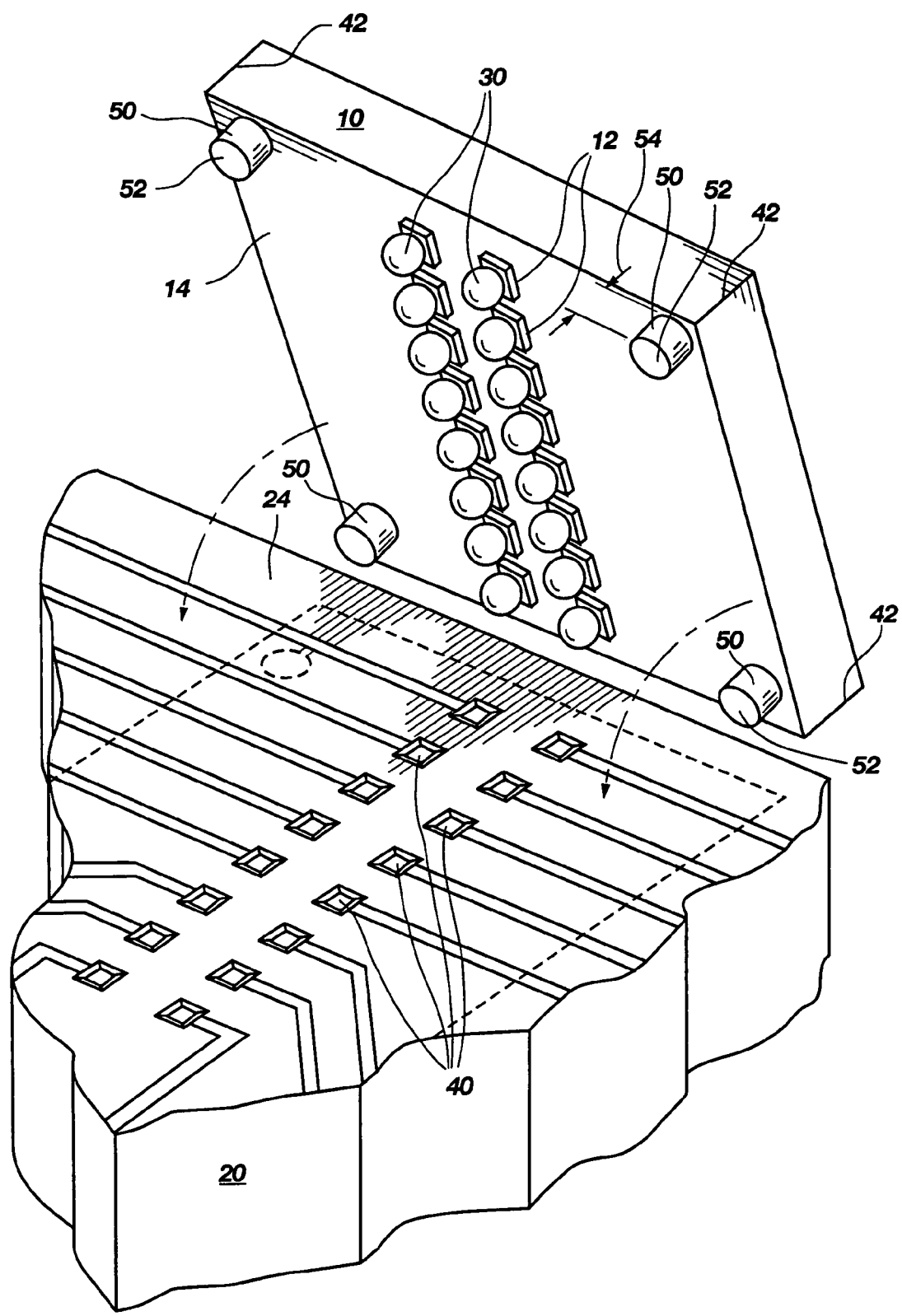
FIG. 5 is an enlarged partial perspective assembly view of a semiconductor device having stabilizers on a surface thereof, the semiconductor device being disposed on a test substrate in a facedown orientation.
Figure 6:
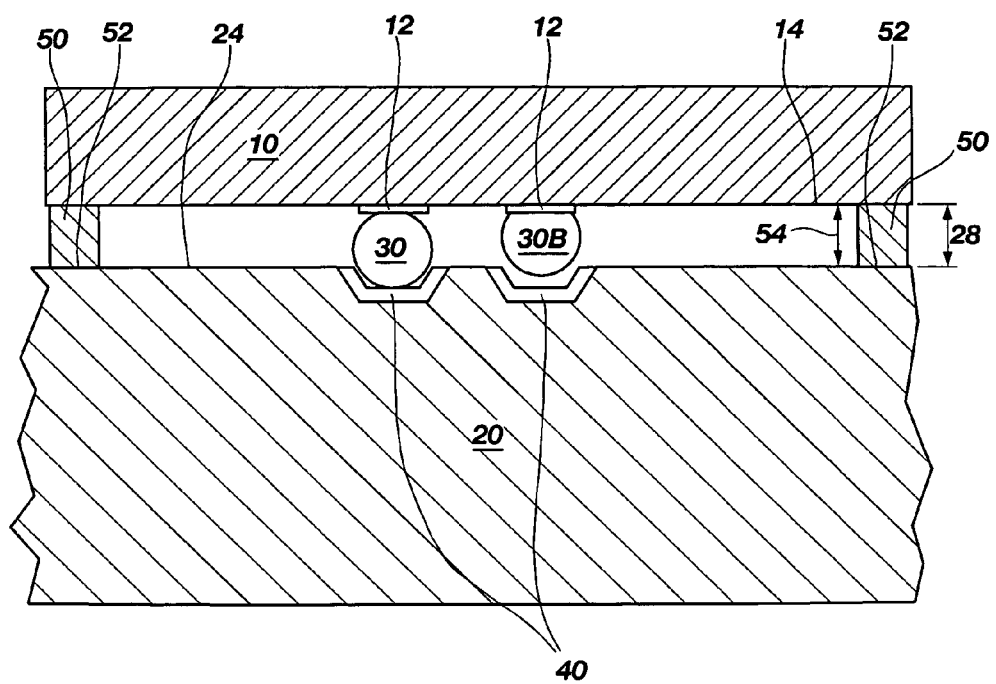
FIG. 6 is a cross-sectional view of an assembly with a semiconductor device disposed on a test substrate in a facedown orientation, the semiconductor device including stabilizers to support the semiconductor device on the test substrate.

FIGS. 5 and 6 illustrate the disposal of a semiconductor device 10 on a test substrate 20 for testing, with semiconductor device 10 being disposed on test substrate 20 in a facedown, or inverted, orientation. Accordingly, semiconductor device 10 may be a LOC-configured semiconductor die, a chip scale package, or any other type of semiconductor device that can be similarly tested.

As depicted in FIG. 5, semiconductor device 10 has four stabilizers 50 protruding from a surface 14 thereof. Stabilizers 50, which are also referred to herein as support structures or outriggers, preferably protrude substantially equal distances from surface 14 to a common plane.

FIGS. 5 and 6 also illustrate semiconductor device 10 as having conductive structures, or conductors, protruding from contact pads 12, such as the bond pads of a semiconductor die, exposed at surface 14 thereof. The conductive structures are shown as solder bumps 30 and 30B secured to contact pads 12. Alternatively, the conductive structures may be any known type of conductive structure, suitably configured as balls, bumps, or pillars. The conductive structures can be formed from any type of conductive material or combination of materials known to be useful as a conductive structure of a semiconductor device, including, without limitation, solders, other metals, metal alloys, conductor filled epoxies, conductive epoxies, and z-axis conductive elastomers. Alternatively, semiconductor device 10 can have bare contact pads 12 that do not have conductive structures, such as solder bumps 30, protruding therefrom.

Test substrate 20 has test pads 40 exposed at a surface 24 thereof. Test pads 40 are configured and positioned to contact solder bumps 30 or other conductive structures protruding from contact pads 12 of semiconductor device 10, as shown in FIGS. 5 and 6. When a semiconductor device 10 lacking conductive structures on the contact pads 12 thereof is to be tested by using test substrate 20, conductive structures can alternatively protrude from test pads 40 of test substrate 20 so as to contact the bare contact pads 12 of such a semiconductor device 10.

With continued reference to FIG. 6, stabilizers 50 that protrude too great a distance 54 from active surface 14 of semiconductor device 10 could prevent shorter conductive structures, such as solder bump 30B, from establishing a reliable electrical connection between a contact pad 12 of semiconductor device 10 and the corresponding test pad 40 of test substrate 20. Thus, stabilizers 50 preferably each extend between the planes of the surfaces 14 and 24 of semiconductor device 10 and test substrate 20, respectively, a distance 54 that is less than or equal to the distance 28 that the planes or surfaces 14 and 24 are spaced apart when conductive structures, such as solder bumps 30, connect contact pads 12 to test pads 40. Accordingly, stabilizers 50 will not prevent the shortest conductive structure, such as solder bump 30B, from connecting a contact pad 12 and a test pad 40 upon assembly of semiconductor device 10 with test substrate 20.

Figure 6A:
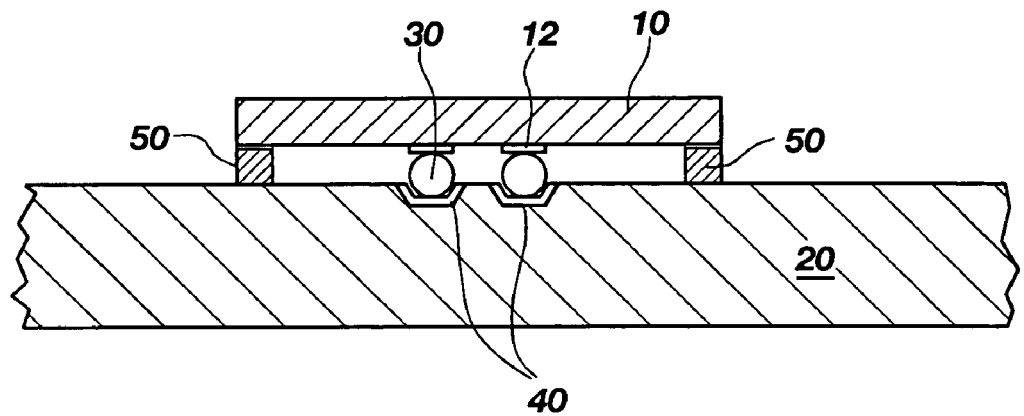
FIG. 6A is a cross-sectional view of an assembly with a semiconductor device disposed on a test substrate in a facedown orientation, the test substrate including stabilizers to support the semiconductor device thereon.
Figure 6B:
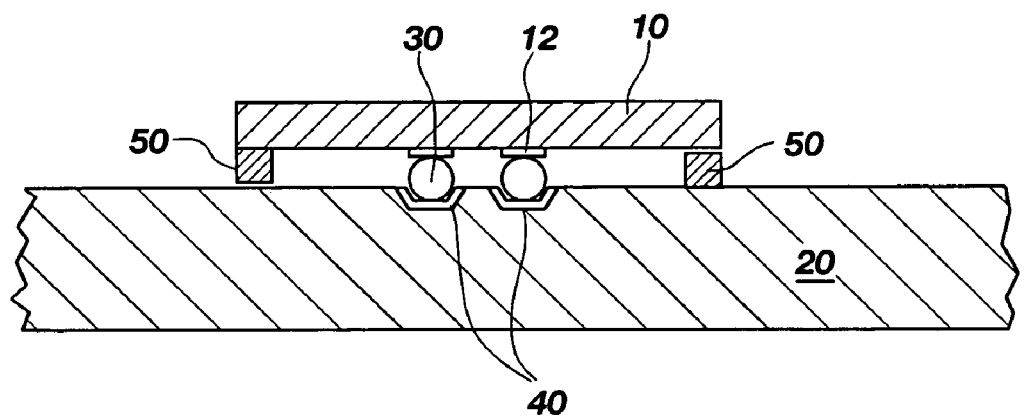
FIG. 6B is a cross-sectional view of an assembly with a semiconductor device disposed on a test substrate in a facedown orientation, the test substrate and semiconductor device each including stabilizers to support the semiconductor device on the test substrate.

While semiconductor device 10 is illustrated in FIG. 5 as having four cylindrical stabilizers 50, one disposed adjacent each corner 42 of surface 14, other numbers, arrangements, and configurations of stabilizers 50 are also within the scope of the present invention. For example, with reference to FIGS. 6A and 6B, stabilizers 50 can alternatively be secured to test substrate 20 or to both test substrate 20 and semiconductor device 10.

Referring again to FIG. 6, when semiconductor device 10 and substrate 20 are assembled, a contact surface 52 of each stabilizer 50 on semiconductor device 10 or test substrate 20 abuts or is positioned in close proximity to the facing surface 24, 14 of the other of test substrate 20 or semiconductor device 10, respectively. As is known in the art, compressive forces may be applied to semiconductor device 10 or test substrate 20 during assembly, while semiconductor device 10 is being tested, or during disassembly. Accordingly, contact surface 52 and the portion of each stabilizer 50 contacting surface 14 or 24 are preferably sized and configured to spread or distribute any compressive forces that may be applied to semiconductor device 10 or to test substrate 20 over relatively large areas of semiconductor device 10 and test substrate 20. By spreading such compressive forces over larger areas of semiconductor device 10 or test substrate 20, damage to semiconductor device 10 or to test substrate 20 that could otherwise be caused by such compressive forces can be prevented. Stabilizers 50 can also be arranged or positioned so as to minimize the likelihood that compressive forces on semiconductor device 10 or test substrate 20 will damage either semiconductor device 10 or test substrate 20.

In addition, stabilizers 50 are configured to have sufficient strength and rigidity to withstand the assembly of semiconductor device 10 with test substrate 20, the testing of semiconductor device 10 on test substrate 20, and the disassembly of semiconductor device 10 from test substrate 20. When disposed on test substrate 20, stabilizers 50 should withstand repeated series of assembling, testing, and disassembling. When disposed on semiconductor device 10, stabilizers 50 are preferably configured to substantially maintain their configurations, dimensions, strength, and rigidity during any subsequent processing of semiconductor device 10, as well as during normal operation of semiconductor device 10.

In addition, stabilizers 50 are preferably configured to, along with conductive structures (e.g., solder bumps 30) protruding from semiconductor device 10, prevent tipping or tilting of semiconductor device 10 relative to test substrate 20.

Figure 7:
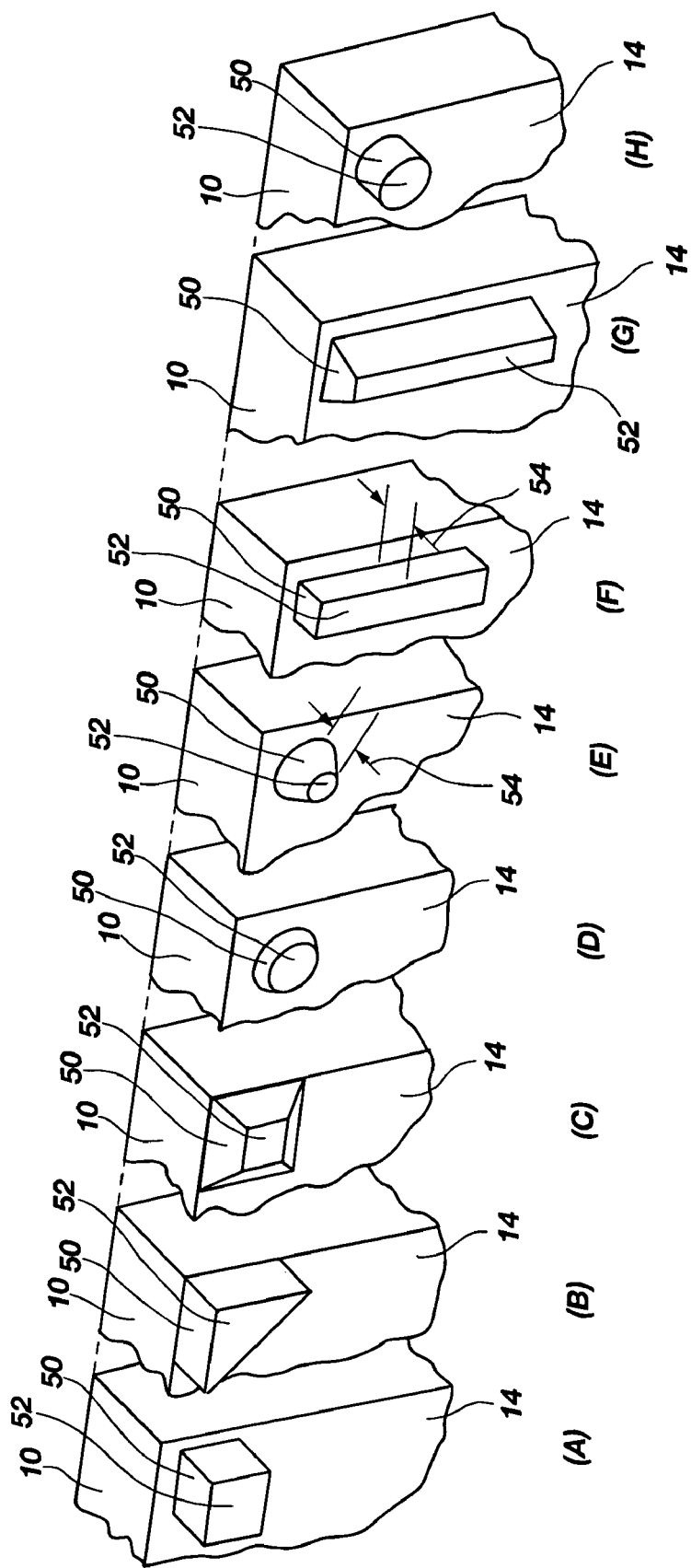
FIGS. 7(A)–7(H) are partial perspective views of differently configured stabilizers.

Although stabilizers 50 are depicted in FIGS. 5 and 7(H) as each having a cylindrical shape, stabilizers 50 may alternatively be configured as pillars having a rectangular cross-section (FIG. 7(A)), pillars of triangular cross-section (FIG. 7(B)), truncated pyramids (FIG. 7(C)), truncated cones (FIG. 7(D)), truncated curved cones (FIG. 7(E)), and elongated strips (FIGS. 7(F) and 7(G)).

By way of example, and not to limit the scope of the present invention. FIGS. 8–15 illustrate various exemplary arrangements, or footprints, of stabilizers 50 (in phantom) relative to a semiconductor device 10. FIGS. 8–15 thus illustrate exemplary locations at which stabilizers 50 may be positioned upon surface 14 of semiconductor device 10 or where stabilizers 50 located on a test substrate will be located relative to surface 14 of semiconductor device 10 upon assembly of semiconductor device 10 with test substrate 20. Thus, in the ensuing description of FIGS. 8–15, stabilizers 50 are discussed in terms of the position in which they will be located upon disposal of semiconductor device 10 facedown on test substrate 20.

Figure 8:
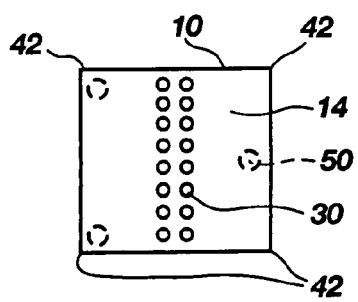
FIGS. 8–15 are plan views of semiconductor devices depicting exemplary locations of stabilizers relative to the surfaces thereof.
Figure 12:
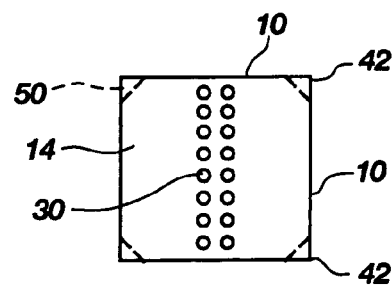
Figure 9:
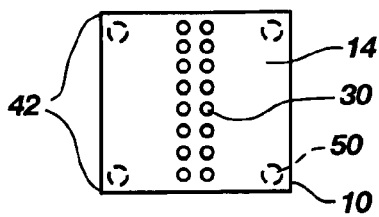
Figure 13:
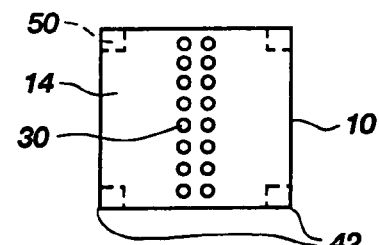
Figure 10:
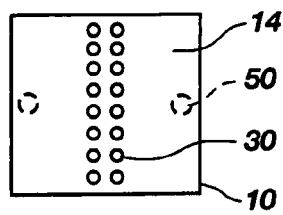

In FIG. 8, two cylindrical stabilizers 50 are positioned to be located at or near adjacent corners 42, and a third stabilizer is positioned to be located proximate the opposite side of semiconductor device 10, between corners 42. In FIG. 9, a stabilizer 50 is positioned to be located at or near each of the four corners 42 of surface 14. FIG. 10 depicts two cylindrical stabilizers 50, which are each positioned to be located adjacent an opposite peripheral edge of semiconductor device 10 on opposite sides of the centrally located rows of solder bumps 30. FIGS. 12 and 13 illustrate stabilizers 50 with generally triangular and generally square cross-sections, respectively, positioned to be located at or proximate to corners 42 of surface 14.

Figure 14:
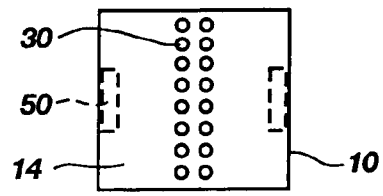
Figure 11:
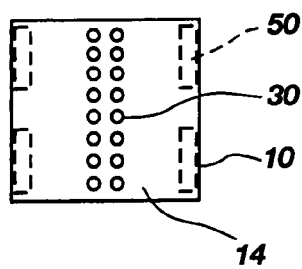
Figure 15:
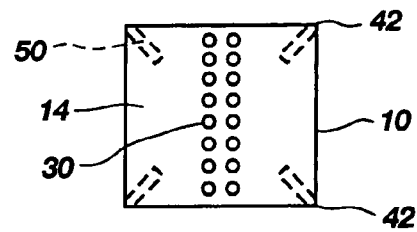
Figure 19:
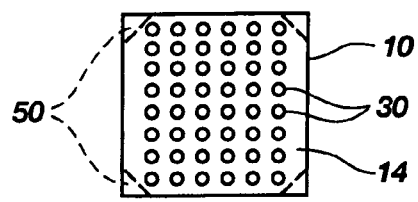
FIG. 19 is a plan view of a ball grid array type substrate, including conductive structures protruding from a surface thereof and stabilizers positioned on the surface.

In FIG. 11, four elongated stabilizers 50 are shown, two stabilizers 50 each positioned to be located adjacent to a portion of and parallel with one edge of semiconductor device 10 and the other two stabilizers 50 similarly positioned to be located adjacent to the opposite peripheral edge of semiconductor device 10. FIGS. 14 and 15 illustrate other orientations of elongated stabilizers 50. In FIG. 14, the two elongated stabilizers 50 are positioned to be located adjacent and parallel to opposite peripheral edges of semiconductor device 10. The four elongated stabilizers 50 depicted in FIG. 15 are positioned to extend from a location adjacent corners 42 diagonally toward the center of surface 14 of semiconductor device 10.

As stabilizers 50 can contact one or both of surface 14 of semiconductor device 10 and surface 24 of substrate 20, stabilizers 50 are preferably fabricated from a dielectric material. In addition, the material from which stabilizers 50 are fabricated may preferably be readily formed to precise dimensions and secured to the surface of either semiconductor device 10 or test substrate 20. Examples of such materials include plastics, photoimageable resins, silicon dioxide, glass (e.g., borophosphosilicate glass ("BPSG"), phosphosilicate glass ("PSG"), borosilicate glass ("BSG")), and silicon nitride.

Figure 16:
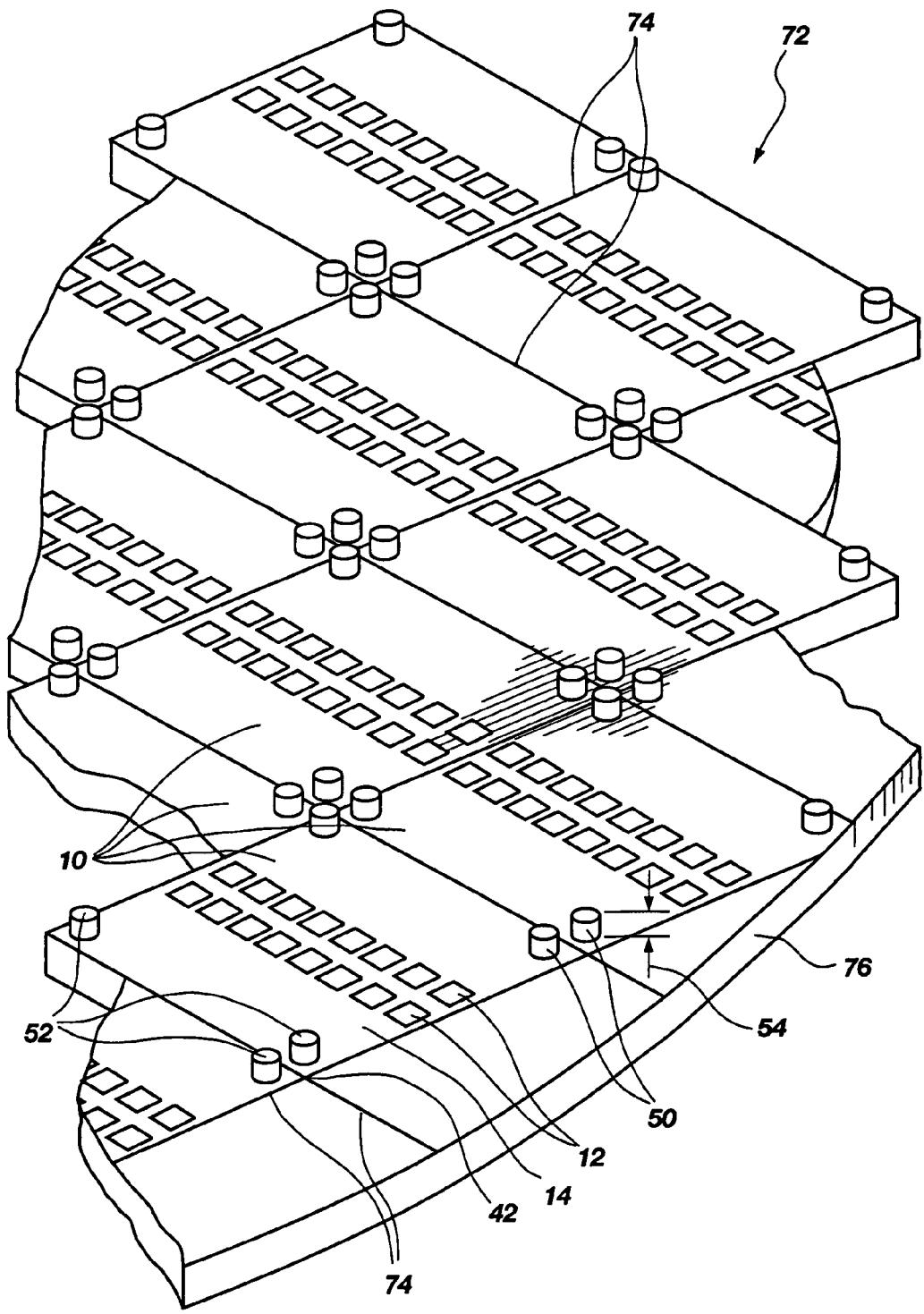
FIG. 16 is a perspective view of a portion of a semiconductor wafer having a plurality of semiconductor devices thereon, illustrating stabilizers being secured to the surfaces of the semiconductor devices at the wafer level.

As shown in FIG. 16, when semiconductor device 10 is a semiconductor die, stabilizers 50 may be fabricated or placed thereon prior to singulating the semiconductor die from a semiconductor wafer 72. As shown, a small portion of a semiconductor wafer 72, bounded by wafer edge 76, comprises a large number of semiconductor devices 10, which will be subsequently singulated, or separated, along scribe lines 74. Each semiconductor device 10 contains electrical circuits which terminate at contact pads 12 exposed at a surface 14 of semiconductor device 10. In FIG. 16, cylindrical stabilizers 50 are positioned on surface 14 adjacent a corner 42 thereof to protrude from surface 14 a distance 54. Stabilizers 50 can similarly be disposed or fabricated on test substrates 20 fabricated from silicon or another semiconductor substrate prior to singulating test substrates 20 from a wafer.

Methods of Fabricating Stabilizers

Several different processes can be used to fabricate stabilizers 50 in accordance with teachings of the present invention. As an example, stabilizers 50 can be preformed from plastic, epoxy or other resins by known processes, such as by molding or micromachining in processes. These stabilizers 50 are then secured to surface 14 of semiconductor device 10 or to surface 24 of test substrate 20 by known processes, such as by the use of an adhesive.

As another example, stabilizers 50 can be fabricated on surface 14, 24 of semiconductor device 10 or test substrate 20, respectively, by applying a layer of insulative material onto surface 14, 24 (e.g., by known deposition processes such as chemical vapor deposition ("CVD") or spin-on-glass ("SOG") processes) followed by removing unwanted portions of the layer (e.g., by use of photomask and etch processes).

In yet another example of a method that can be used to fabricate stabilizers 50, a photoresist material is applied to surface 14, 24 of semiconductor device 10 or test substrate 20, respectively. The photoresist is then masked, exposed, and developed to form stabilizers 50 in desired locations on surface 14, 24.

Stereolithographic processes are also useful for fabricating stabilizers 50. When stereolithographic processes are used, stabilizers 50 can have one or more layers of at least partially consolidated material. Stereolithographic processes can be used to fabricate stabilizers 50 in situ on semiconductor device 10 or test substrate 20, or separately therefrom.

Of the above methods, the stereolithographic process is currently the preferred embodiment of the method of the present invention and will, therefore, be discussed at length.

Stereolithography Apparatus and Methods

Figure 17:
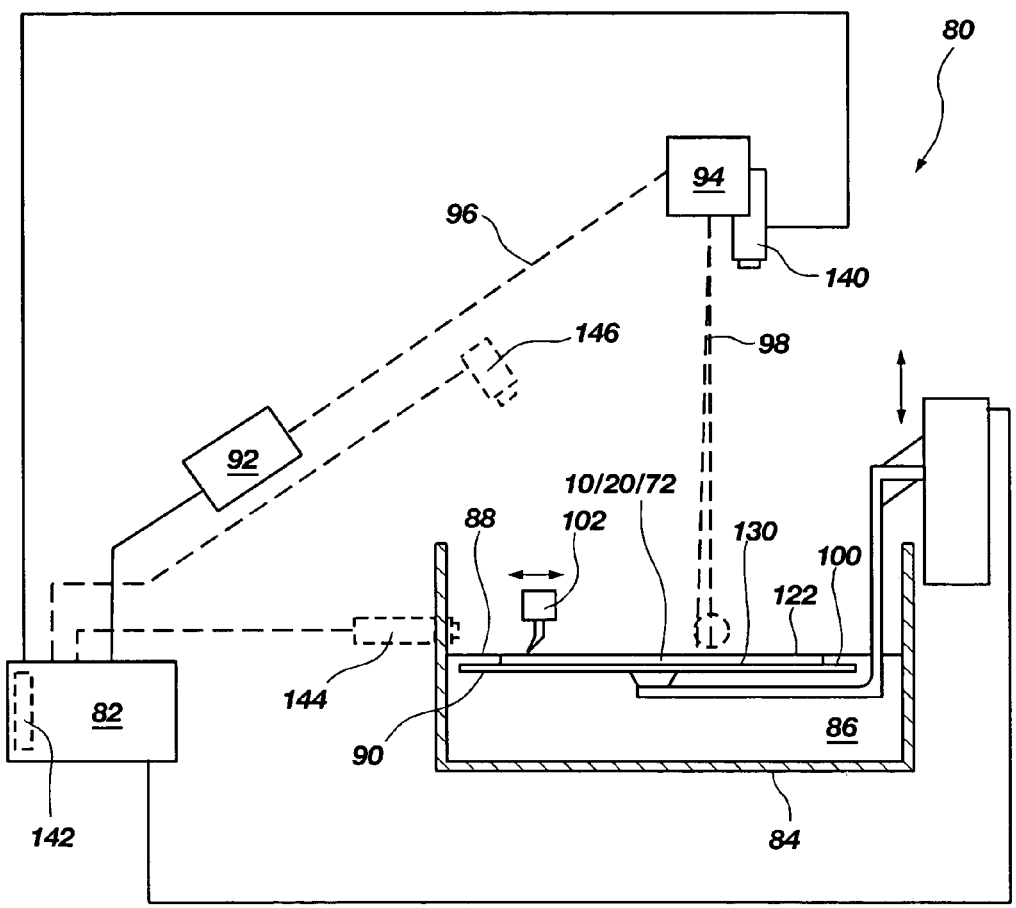
FIG. 17 is a schematic representation of an exemplary stereolithography apparatus that can be employed in the method of the present invention to fabricate the stabilizers of the present invention.

FIG. 17 schematically depicts various components, and operation, of an exemplary stereolithography apparatus 80 to facilitate the reader's understanding of the technology employed in implementation of the stereolithography embodiment of the method of the present invention, although those of ordinary skill in the art will understand and appreciate that apparatus of other designs and manufacture may be employed in practicing the method of the present invention. The preferred, basic stereolithography apparatus for implementation of the method of the present invention, as well as operation of such apparatus, are described in great detail in United States patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference.

With reference again to FIG. 17 and as noted above, a 3-D CAD drawing of an object to be fabricated in the form of a data file is placed in the memory of a computer 82 controlling the operation of apparatus 80, if computer 82 is not a CAD computer in which the original object design is effected. In other words, an object design may be effected in a first computer in an engineering or research facility and the data files transferred via wide or local area network, tape, disc, CD-ROM, or otherwise as known in the art to computer 82 of apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 80 also includes a reservoir 84 (which may comprise a removable reservoir interchangeable with others containing different materials) of liquid material 86 to be employed in fabricating the intended object. In the currently preferred embodiment, the liquid is a photo-curable polymer, or "photopolymer," that in response to light in the UV wavelength range. The surface level 88 of material 86 is automatically maintained at an extremely precise, constant magnitude by devices known in the art responsive to output of sensors within apparatus 80 and preferably under control of computer 82. A support platform or elevator 90, precisely vertically movable in fine, repeatable increments responsive to control of computer 82, is located for movement downward into and upward out of material 86 in reservoir 84.

An object may be fabricated directly on platform 90, or on a substrate disposed on platform 90. When the object is to be fabricated on a substrate disposed on platform 90, the substrate may be positioned on platform 90 and secured thereto by way of one or more base supports 122. Such base supports 122 may be fabricated before or simultaneously with the stereolithographic fabrication of one or more objects on platform 90 or a substrate disposed thereon. These supports 122 may support, or prevent lateral movement of, the substrate relative to a surface 100 of platform 90. Supports 122 may also provide a perfectly horizontal reference plane for fabrication of one or more objects thereon, as well as facilitate the removal of a substrate from platform 90 following the stereolithographic fabrication of one or more objects on the substrate. Moreover, where a so-called "recoater" blade 102 is employed to form a layer of material on platform 90 or a substrate disposed thereon, supports 122 can preclude inadvertent contact of recoater blade 102, to be described in greater detail below, with surface 100 of platform 90. Of course, alternative methods and apparatus for securing a substrate to platform 90 and immobilizing the substrate relative to platform 90 may also be used and are within the scope of the present invention.

Apparatus 80 has a UV wavelength range laser plus associated optics and galvanometers (collectively identified as laser 92) for controlling the scan of laser beam 96 in the X-Y plane across platform 90 and has associated therewith mirror 94 to reflect beam 96 downwardly as beam 98 toward surface 100 of platform 90. Beam 98 is traversed in a selected pattern in the X-Y plane, that is to say in a plane parallel to surface 100, by initiation of the galvanometers under control of computer 82 to at least partially cure, by impingement thereon, selected portions of material 86 disposed over surface 100 to at least a partially consolidated (e.g., semisolid) state. The use of mirror 94 lengthens the path of the laser beam 96, effectively doubling same, and provides a more vertical beam 98 than would be possible if the laser 92 itself wee mounted directly above platform surface 100, thus enhancing resolution.

Figure 18:
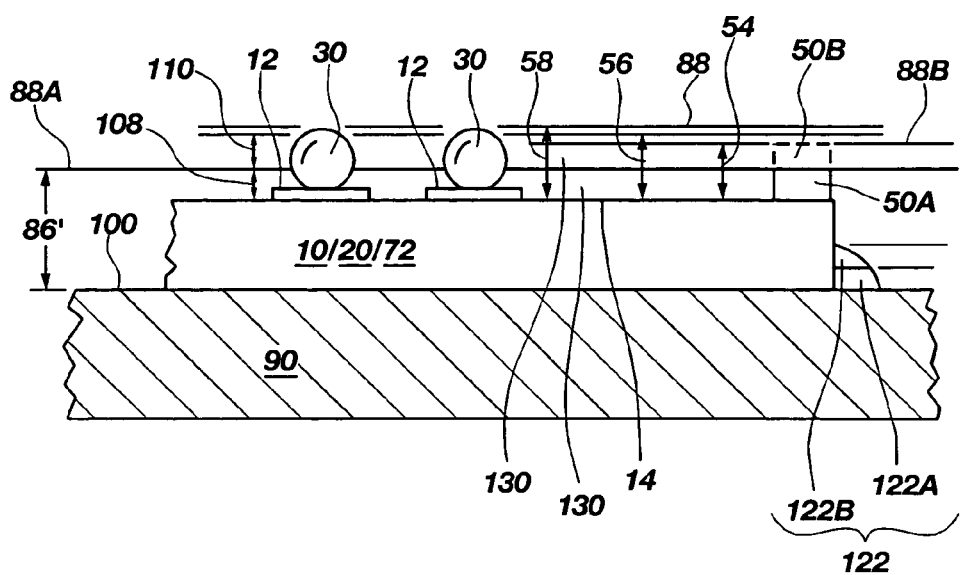
FIG. 18 is a partial cross-sectional side view of a semiconductor device or test substrate disposed on a platform of a stereolithographic apparatus for the formation of stabilizers on the semiconductor device or test substrate.

Referring now to FIGS. 17 and 18, data from the STL files resident in computer 82 is manipulated to build an object, such as stabilizers 50 illustrated in FIGS. 5–16 and 19 or base supports 122, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.0001 to about 0.0300 inch thick. As mentioned previously, a thinner slice promotes higher resolution by enabling better reproduction of fine vertical surface features of the object or objects to be fabricated.

When one or more base supports 122 are to be stereolithographically fabricated, supports 122 may be programmed as a separate STL file from the other objects to be fabricated. The primary STL file for the object or objects to be fabricated and the STL file for base support(s) 122 are merged.

Before fabrication of a first layer for a support 122 or an object to be fabricated is commenced, the operational parameters for apparatus 80 are set to adjust the size (diameter if circular) of the beam 98 used to cure material 86. In addition, computer 82 automatically checks and, if necessary, adjusts by means known in the art, the surface level 88 of material 86 in reservoir 84 to maintain same at an appropriate focal length for laser beam 98. U.S. Pat. No. 5,174,931, referenced above and previously incorporated herein by reference, discloses one suitable level control system. Alternatively, the height of mirror 94 or another optics and scan controller may be adjusted responsive to a detected surface level 88 to cause the focal point of laser beam 98 to be located precisely at the surface of material 86 at surface level 88 if level 88 is permitted to vary, although this approach is more complex. Platform 90 may then be submerged in material 86 in reservoir 84 to a depth equal to the thickness of one layer or slice of the object to be formed, and the liquid surface level 88 is readjusted as required to accommodate material 86 displaced by submergence of platform 90. Laser 92 is then activated so laser beam 98 will scan unconsolidated (e.g., liquid or powdered) material 86 disposed over surface 100 of platform 90 to at least partially consolidate (e.g., polymerize to at least a semisolid state) material 86 at selected locations, defining the boundaries of a first layer 122A of base support 122 and filling in solid portions thereof. Platform 90 is then lowered by a distance equal to thickness of second layer 122B, and laser beam 98 scanned to define and fill in the second layer while simultaneously bonding the second layer to the first. The process may be then repeated, as often as necessary, layer by layer, until base support 122 is completed. Platform 90 is then moved relative to the mirror 94 to form any additional base supports 122 on platform 90 or a substrate disposed thereon or to fabricate objects upon platform 90, base support 122, or a substrate, as provided in the control software. The number of layers required to erect support 122 or one or more other objects to be formed depends upon the height of the object or objects to be formed and the desired layer thickness 108, 110. The layers of a stereolithographically fabricated structure with a plurality of layers may have different thicknesses.

If a recoater blade 102 is employed, the process sequence is somewhat different. In this instance, surface 100 of platform 90 is lowered into unconsolidated (e.g., liquid) material 86 below surface level 88 a distance greater than a thickness of a single layer of material 86 to be cured, then raised above surface level 88 until platform 90, a substrate disposed thereon, or a structure being formed on platform 90 or a substrate is precisely one layer's thickness below blade 102. Blade 102 then sweeps horizontally over platform 90 or (to save time) at least over a portion thereof on which one or more objects are to be fabricated to remove excess material 86 and leave a film of precisely the desired thickness. Platform 90 is then lowered so that the surface of the film and surface level 88 are coplanar and the surface of the unconsolidated material 86 is still. Laser 92 is then initiated to scan with laser beam 98 and define the first layer 130. The process is repeated, layer by layer, to define each succeeding layer 130 and simultaneously bond same to the next lower layer 130 until all of the layers of the object or objects to be fabricated are completed. A more detailed discussion of this sequence and apparatus for performing same is disclosed in U.S. Pat. No. 5,174,931, previously incorporated herein by reference.

As an alternative to the above approach to preparing a layer of material 86 for scanning with laser beam 98, a layer of unconsolidated (e.g., liquid) material 86 may be formed on surface 100 of support platform 90, on a substrate disposed on platform 90, or on one or more objects being fabricated by lowering platform 90 to flood material over surface 100, over a substrate disposed thereon, or over the highest completed layer of the object or objects being formed, then raising platform 90 and horizontally traversing a so-called "meniscus" blade horizontally over platform 90 to form a layer of unconsolidated material having the desired thickness over platform 90, the substrate, or each of the objects being formed. Laser 92 is then initiated and a laser beam 98 scanned over the layer of unconsolidated material to define at least the boundaries of the solid regions the next higher layer.

Yet another alternative to layer preparation of unconsolidated (e.g., liquid) material 86 is to merely lower platform 90 to a depth equal to that of a layer of material 86 to be scanned, and to then traverse a combination flood bar and meniscus bar assembly horizontally over platform 90, a substrate disposed on platform 90, or one or more objects being formed to substantially concurrently flood material 86 thereover and to define a precise layer thickness of material 86 for scanning.

All of the foregoing approaches to liquid material flooding and layer definition and apparatus for initiation thereof are known in the art and are not material to practice of the present invention, so no further details relating thereto will be provided herein.

In practicing the present invention, a commercially available stereolithography apparatus operating generally in the manner as that described above with respect to apparatus 80 of FIG. 17 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc., of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and 7000 systems, and Cibatool SL 7510 resin for the SLA-7000 system. All of these photopolymers are available from Ciba Specialty Chemicals Inc.

By way of example and not limitation, the layer thickness of material 86 to be formed, for purposes of the invention, may be on the order of about 0.0001 to 0.0300 inch, with a high degree of uniformity. It should be noted that different material layers may have different heights, so as to form a structure of a precise, intended total height or to provide different material thicknesses for different portions of the structure. The size of the laser beam "spot" impinging on the surface of material 86 to cure same may be on the order of 0.001 inch to 0.008 inch Resolution is preferably ±0.0003 inch in the X-Y plane (parallel to surface 100) over at least a 0.5 inch×0.25 inch field from a center point, permitting a high resolution scan effectively across a 1.0 inch×0.5 inch area Of course, it is desirable to have substantially this high a resolution across the entirety of surface 100 of platform 90 to be scanned by laser beam 98, such area being termed the "field of exposure," such area being substantially coextensive with the vision field of a machine vision system employed in the apparatus of the invention as explained in more detail below. The longer and more effectively vertical the path of laser beam 96/98, the greater the achievable resolution.

Referring again to FIG. 17, it should be noted that apparatus 80 useful in the method of the present invention includes a camera 140 which is in communication with computer 82 and preferably located, as shown, in close proximity to mirror 94 or another optics and scan controller located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed as known in the art to respond to images generated by camera 140 and processed by board 142. Camera 140 and board 142 may together comprise a so-called "machine vision system" and, specifically, a "pattern recognition system" (PRS), operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guide Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Stereolithographic Fabrication of the Stabilizers

In order to facilitate fabrication of one or more stabilizers 50 in accordance with the method of the present invention with apparatus 80, a data file representative of the size, configuration, thickness and surface topography of, for example, a particular type and design of semiconductor device 10 or other substrate upon which one or more stabilizers 50 are to be mounted, is placed in the memory of computer 82. Also, if it is desired that the stabilizers 50 be so positioned on semiconductor device 10 taking into consideration features of test substrate 20 (see FIG. 5), a data file representative of test substrate 20 and the features thereof may be placed in memory.

One or more semiconductor devices 10, test substrates 20, or a wafer 72 (see FIG. 16) including a large number of semiconductor devices 10 or test substrates 20 formed thereon, may be placed on surface 100 of platform 90 for fabrication of stabilizers 50 on one or more semiconductor devices 10 or test substrates 20. If one or more semiconductor devices 10, test substrates 20, or a wafer 72 is to be held on or supported above platform 90 by stereolithographically formed base supports 122, one or more layers of material 86 are sequentially disposed on surface 100 and selectively altered by use of laser 92 to form base supports 122.

Camera 140 is then activated to locate the position and orientation of each semiconductor device 10 or test substrate 20, including those on a wafer 72 (see FIG. 16), upon which stabilizers 50 are to be fabricated. The features of each semiconductor device 10, test substrate 20, or wafer 72 are compared with those in the data file residing in memory, the locational and orientational data for each semiconductor device 10 or test substrate 20 then also being stored in memory. It should be noted that the data file representing the design size, shape and topography for each semiconductor device 10 or test substrate 20 may be used at this juncture to detect physically defective or damaged semiconductor devices 10 or test substrates 20 prior to fabricating stabilizers 50 thereon or before conducting further processing or assembly of semiconductor device 10 or test substrate 20. Accordingly, such damaged or defective semiconductor devices 10 or test substrates 20 can be deleted from the process of fabricating stabilizers 50, from further processing, or from assembly with other components. It should also be noted that data files for more than one type (size, thickness, configuration, surface topography) of each semiconductor device 10 or test substrate 20 may be placed in computer memory and computer 82 programmed to recognize not only the locations and orientations of each semiconductor device 10 or test substrate 20, but also the type of semiconductor device 10 or test substrate 20 at each location upon platform 90 so that material 86 may be at least partially consolidated by laser beam 98 in the correct pattern and to the height required to define stabilizers 50 in the appropriate, desired locations on each semiconductor device 10 or test substrate 20.

Continuing with reference to FIGS. 17 and 18, wafer 72 or the one or more semiconductor devices 10 or test substrates 20 on platform 90 may then be submerged partially below the surface level 88 of liquid material 86 to a depth greater than the thickness 86' of a first layer of material 86 to be at least partially consolidated (e.g., cured to at least a semisolid state) to form the lowest layer 130 of each stabilizer 50 at the appropriate location or locations on each semiconductor device 10 or test substrate 20, then raised to a depth equal to the layer thickness, surface 88 of material 86 being allowed to become calm. Photopolymers that are useful as material 86 exhibit a desirable dielectric constant, low shrinkage upon cure, are of sufficient (i.e., semiconductor grade) purity, exhibit good adherence to other semiconductor device materials, and have a sufficiently similar coefficient of thermal expansion (CTE) to the material of the conductive structures (e.g., solder or other metal or metal alloy). As used herein, the term "solder ball" may also be interpreted to encompass conductive or conductor filled epoxy. Preferably, the CTE of material 86 is sufficiently similar to that of the conductive structures to prevent undue stressing of the conductive structures or of semiconductor device 10 or test substrate 20 during thermal cycling thereof in testing, subsequent processing, and subsequent normal operation. One area of particular concern in determining resin suitability is the substantial absence of mobile ions and, specifically, of fluoride ions. Exemplary photopolymers exhibiting these properties are believed to include, but are not limited to, the above-referenced resins from Ciba Specialty Chemicals Inc.

Laser 92 is then activated and scanned to direct beam 98, under control of computer 82, toward specific locations of surface 88 relative to each semiconductor device 10 to effect the aforementioned partial cure of material 86 to form a first layer 50A of each stabilizer 50. Platform 90 is then lowered into reservoir 84 and raised a distance equal to the desired thickness of another layer 130 of each stabilizer 50, and laser 92 is activated to add another layer 130 to each stabilizer 50 under construction. This sequence continues, layer by layer, until each of the layers of stabilizers 50 have been completed.

In FIG. 18, the first layer 130 of stabilizer 50 is identified by numeral 50A, and the second layer 130 is identified by numeral 50B. Likewise, the first layer 130 of base support 122 is identified by numeral 122A and the second layer 130 is identified by numeral 122B. As illustrated, both base support 122 and stabilizer 50 have only two layers 130. Stabilizers 50 with any number of layers are, however, within the scope of the present invention.

Each layer 130 of stabilizer 50 is preferably built by first defining any internal and external object boundaries of that layer 130 with a beam 98, then hatching solid areas of stabilizer 50 located within the object boundaries with laser beam 98. An internal boundary of a layer 130 may comprise a through-hole, avoid, or a recess in stabilizer 50, for example. If a particular layer 130 includes a boundary of a void in the object above or below that layer 130, then laser beam 98 is scanned in a series of closely spaced, parallel vectors so as to develop a continuous surface, or skin, with improved strength and resolution. The time it takes to form each layer 130 depends upon its geometry, the surface tension and viscosity of material 86, and the thickness of the layer.

Alternatively, stabilizers 50 may each be formed as a partially cured outer skin extending above surface 14 of semiconductor device 10 or above surface 24 of test substrate 20 and forming a dam within which unconsolidated material 86 can be contained. This may be particularly useful where the stabilizers 50 protrude a relatively high distance 54, 56, 58 from surface 14, 24. In this support platform 90 may be submerged so that material 86 enters the area within the dam, raised above surface level 88, 88A and 88B (FIG. 18) and then laser beam 98 is activated and scanned to at least partially cure material 86 residing within the dam or, alternatively, to merely cure a "skin" comprising the contact surface 52. While material 86 within contact surface 52 will eventually cure due to the cross-linking initiated in contact surface 52, a final cure of the material of the stabilizers 50 may be subsequently accelerated by broad-source UV radiation in a chamber, or by thermal cure in an oven. In this manner, stabilizers 50 of extremely precise dimensions may be formed of 86 by apparatus 80 in minimal time.

Once stabilizers 50, or at least the outer skins thereof, have been fabricated, platform 90 is elevated above surface level 88 of material 86 and platform 90 is removed from apparatus 80, along with any substrate (e.g. semiconductor device 10, test substrate 20, or wafer 72 (see FIG. 16)) disposed thereon and any stereolithographically fabricated structures, such as stabilizers 50. Excess, unconsolidated material 86 (e.g., uncured liquid) may be manually removed from platform 90, from any substrate disposed on platform 90, and from stabilizers 50. Each semiconductor device 10 or test substrate 20 is removed from platform 90, such as by cutting semiconductor device 10 or test substrate 20 free of base supports 122. Alternatively, base supports 122 may be configured to readily release semiconductor device 10, test substrate 20, wafer 72, or another substrate. As another alternative, a solvent may be employed to release base supports 122 from platform 90. Such release and solvent materials are known in the art. See, for example, U.S. Pat. No. 5,447,822 referenced above and previously incorporated herein by reference.

Stabilizers 50 and semiconductor device 10 or test substrate 20 may also be cleaned by use of known solvents that will not substantially degrade, deform, or damage stabilizers 50 or a substrate to which stabilizers 50 are secured.

As noted previously, stabilizers 50 may then require postcuring. Stabilizers 50 may have regions of unconsolidated material contained within a boundary or skin thereof, or material 86 may be only partially consolidated (e.g., polymerized or cured) and exhibit only a portion (typically 40% to 60%) of its fully consolidated strength. Postcuring to completely harden stabilizers 50 may be effected in another apparatus projecting UV radiation in a continuous manner over stabilizers 50 or by thermal completion of the initial, UV-initiated partial cure.

It should be noted that the height, shape, or placement of each stabilizer 50 on each specific semiconductor device 10 or test substrate 20 may vary, again responsive to output of camera 140 or one or more additional cameras 144 or 146, shown in broken lines in FIG. 17, detecting the protrusion of unusually high (or low) conductors which will affect the desired distance 54, 56, 58 that stabilizers 50 will protrude from surface 14. In any case, laser 92 is again activated to at least partially cure material 86 residing on each semiconductor device 10 or test substrate 20 to form the layer or layers of each stabilizer 50.

Although FIGS. 17 and 18 illustrate the stereolithographic fabrication of stabilizers 50 on a substrate, such as a semiconductor device 10, test substrate 20 or a wafer 72 (FIG. 16) including a plurality of semiconductor devices 10 or test substrates 20, stabilizers 50 can be fabricated separately from a substrate, then secured to a substrate (e.g., semiconductor device 10, test substrate 20, or wafer 72), by known processes, such as by the use of a suitable adhesive material.

While a variety of methods may be used to fabricate stabilizers 50, the use of a stereolithographic process as exemplified above is a preferred method because a large number of stabilizers 50 may be fabricated in a short time, the stabilizer height and position are computer controlled to be extremely precise, wastage of unconsolidated material 86 is minimal, and the stereolithography method requires less handling of semiconductor devices 10, test substrates 20, or other substrates than the other viable methods indicated above.

Stereolithography is also an advantageous method of fabricating stabilizers 50 according to the present invention since stereolithography can be conducted at substantially ambient temperature, the small spot size and rapid traverse of laser beam 98 resulting in negligible thermal stress upon the semiconductor devices 10, test substrates 20, and other substrates, as well as on the features thereof.

The stereolithography fabrication process may also advantageously be conducted at the wafer level or on multiple substrates, saving fabrication time and expense. As the stereolithography method of the present invention recognizes specific semiconductor devices 10 or test substrates 20, variations between individual substrates are accommodated. Accordingly, when the stereolithography method of the present invention is employed, stabilizers 50 can be simultaneously fabricated on different types of semiconductor devices 10 or test substrates 20, as well as on both semiconductor devices 10 and test substrates 20. In addition, as shown in FIG. 5, each stabilizer 50 on each particular semiconductor device 10 or test substrate 20 may be precisely positioned to match a desired "footprint" for stabilizers 50 on the other of test substrate 20 or semiconductor device 10.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A semiconductor device, comprising:
   a semiconductor device having contact pads exposed at a surface thereof, the contact pads being arranged in at least one substantially linear relationship positioned at or proximate a centerline of the semiconductor device and being configured to communicate with corresponding test pads of a test substrate from which the semiconductor device is detachable upon disposing the semiconductor device face-down over the test substrate; and
   at least one stabilizer secured to and protruding from the surface of the semiconductor device, the at least one stabilizer being configured to at least partially stabilize an orientation of the semiconductor device upon disposal thereof face-down over the test substrate and including a plurality of adjacent, mutually adhered layers regions of the same material.

2. The semiconductor device of claim 1, wherein the at least one stabilizer protrudes from the surface at most a distance between a plane of the surface of the semiconductor device and a plane of a surface of the test substrate upon disposing the semiconductor device face-down over the test substrate.

3. The semiconductor device of claim 2, wherein the at least one stabilizer protrudes from the surface at most the distance between the plane of the surface of the semiconductor device and the plane of the surface of the test substrate when at least one conductor connects at least one of the contact pads and a corresponding one of the test pads.

4. The semiconductor device of claim 1, wherein the at least one stabilizer comprises a dielectric material.

5. The semiconductor device of claim 1, wherein the at least one stabilizer comprises a photopolymer.

6. The semiconductor device of claim 5, wherein the photopolymer is at least semisolid.

7. The semiconductor device of claim 1, wherein the at least one stabilizer is positioned to be located proximate a corner of the surface.

8. The semiconductor device of claim 1, wherein the at least one stabilizer is positioned to be located proximate an edge of the surface.

9. The semiconductor device of claim 1, wherein the at least one stabilizer has a cross-sectional plan of one of quadrilateral, round, oval, and triangular.

10. The semiconductor device of claim 1, wherein the at least one stabilizer is elongated in a direction parallel to a plane in which the semiconductor device is located.

11. The semiconductor device of claim 1, wherein the semiconductor device comprises a semiconductor wafer.

12. The semiconductor device of claim 1, wherein the semiconductor device comprises a semiconductor die.

13. The semiconductor device of claim 1, wherein the semiconductor device comprises a chip-scale package.

14. The semiconductor device of claim 1, wherein the test substrate also includes at least one stabilizer configured to at least partially stabilize the test substrate upon disposing the semiconductor device face-down over the test substrate.

15. An assembly of a semiconductor device and a test substrate, comprising:
   a test substrate with a plurality of test pads exposed at a surface thereof and arranged in at least one substantially linear relationship;

a semiconductor device with a plurality of contact pads exposed at a surface thereof, the plurality of contact pads being arranged in at least one substantially linear relationship which is located at or proximate a centerline of the semiconductor device, the surface of the semiconductor device detachably assembled with and facing the surface of the test substrate with the plurality of contact pads in temporary communication with corresponding test pads of the plurality of test pads; and at least one stabilizer secured to a surface of the semiconductor device and disposed between the test substrate and the semiconductor device.

16. The assembly of claim 15, wherein the at least one stabilizer is secured to the surface of the test substrate.

17. The assembly of claim 15, wherein the at least one stabilizer is secured to the surface of the semiconductor device.

18. The assembly of claim 15, comprising a plurality of stabilizers, at least one of the plurality of stabilizers being secured to the surface of the test substrate and at least one other of the plurality of stabilizers being secured to the surface of the semiconductor device.

19. The assembly of claim 15, wherein the at least one stabilizer comprises a photopolymer.

20. The assembly of claim 19, wherein the at least one stabilizer has a plurality of adjacent, mutually adhered regions.

21. The assembly of claim 15, wherein the photopolymer is at least semisolid.

22. The assembly of claim 15, wherein the at least one stabilizer extends between a plane of the surface of the test substrate and a plane of the surface of the semiconductor device at most a distance between the planes of the surfaces upon establishing communication between the plurality of contact pads and the corresponding test pads.

23. The assembly of claim 15, further comprising at least one conductive structure disposed between the test substrate and the semiconductor device.

24. The assembly of claim 23, wherein the at least one stabilizer extends between a plane of the surface of the test substrate and a plane of the surface of the semiconductor device at most a distance the at least one conductive structure extends between the planes of the surfaces.

* * * * *

UNITED STATES PATENT AND TRADEMARK OFFICE
CERTIFICATE OF CORRECTION

PATENT NO. : 7,138,653 B2  Page 1 of 1
APPLICATION NO. : 09/590527
DATED : November 21, 2006
INVENTOR(S) : Akram It is certified that error appears in the above-identified patent and that said Letters Patent is hereby corrected as shown below:

On the Title Page, Item -57-, under "Abstract", line 16, delete "nay" and insert -- may --, therefor.

In column 18, line 12, in Claim 1, after "substrate" insert -- , --.

In column 18, line 13, in Claim 1, after "detachable" insert -- , --.

Signed and Sealed this

First Day of April, 2008

JON W. DUDAS
*Director of the United States Patent and Trademark Office*